US008417505B1

(12) United States Patent
Guo (10) Patent No.: US 8,417,505 B1
(45) Date of Patent: Apr. 9, 2013

(54) SYSTEM AND METHOD FOR SIMULATING A TRANSMISSION GATE NETWORK AND A BI-DIRECTIONAL CONNECT MODULE WITHIN AN ANALOG AND MIXED-SIGNAL CIRCUIT

(75) Inventor: Xiaobo Guo, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 365 days.

(21) Appl. No.: 12/821,030

(22) Filed: Jun. 22, 2010

(51) Int. Cl.
*G06F 17/50* (2006.01)
*G06G 7/62* (2006.01)

(52) U.S. Cl. .......................................... 703/14; 703/13

(58) Field of Classification Search .............. 703/13, 703/14; 716/101, 106
See application file for complete search history.

(56) References Cited

U.S. PATENT DOCUMENTS

| | | | | |
|---|---|---|---|---|
| 6,985,842 | B2 * | 1/2006 | Grupp et al. .................. | 703/15 |
| 7,523,424 | B2 * | 4/2009 | Kolpekwar et al. ........... | 716/103 |
| 7,574,342 | B2 * | 8/2009 | Kundert ........................ | 703/13 |
| 7,672,827 | B1 * | 3/2010 | Schapira et al. ............... | 703/14 |
| 2007/0244686 | A1 * | 10/2007 | Chang et al. .................. | 703/19 |

OTHER PUBLICATIONS

Zinke, O.; , "Bi-directional mixed signal connection modules for automatic insertion," Behavioral Modeling and Simulation, 2002. BMAS 2002. Proceedings of the 2002 IEEE International Workshop on , vol., no., pp. 102-107, Oct. 6-8, 2002.*
Leung, S.S.; , "Behavioral Modeling of Transmission Gates in VHDL," Design Automation, 1989. 26th Conference on , vol., no., pp. 746-749, Jun. 25-29, 1989.*
Kundert et al., The Designer's Guide to Verilog-AMS, Jun. 2004, Springer US, Chapter 4, Mixed-Signal Modeling, pp. 99-148.*

* cited by examiner

*Primary Examiner* — Mary C Jacob
*Assistant Examiner* — Aniss Chad
(74) *Attorney, Agent, or Firm* — Kenyon & Kenyon LLP (57) ABSTRACT

The present invention provides systems and methods for simulating an analog and mixed-signal circuit design comprising an analog circuit segment and a transmission gate network of a digital circuit segment, where the analog circuit segment is connected to the transmission gate network using a bi-directional connect module, where the analog circuit segment contributes with its own driving force to the digital circuit segment as an equivalent to a driver, and where the digital circuit segment contributes with its own driving force to the analog circuit segment. Additionally, in some systems and methods of the current invention, the bi-directional connect module defers to the transmission gate network any resolution of digital logic values to analog voltages, and any resolution of analog voltages to digital logic values.

22 Claims, 7 Drawing Sheets

SYSTEM AND METHOD FOR SIMULATING A TRANSMISSION GATE NETWORK AND A BI-DIRECTIONAL CONNECT MODULE WITHIN AN ANALOG AND MIXED-SIGNAL CIRCUIT

RELATED APPLICATION

The present application is related to co-pending U.S. application Ser. No. 12/838,348, filed Jul. 16, 2010, entitled "System And Method For Simulating A Bi-Directional Connect Module Within An Analog And Mixed-Signal Circuit."

FIELD OF THE INVENTION

The present invention relates to circuit designs, and more particularly, simulating mixed-signal circuit designs, including a digital transmission gate connected to an analog circuit using a bi-directional connect module.

DESCRIPTION OF THE RELATED ART

In order to develop, simulate and test analog and mixed-signal circuit designs, those in the semiconductor and electronic design industry utilize analog-mixed signal (AMS) extensions to such hardware descriptor languages (HDLs) as Verilog and VHDL to describe and define the behavior the behavior of the circuit design—Verilog-AMS for Verilog and VHDL-AMS for VHDL. The language extensions not only provide the ability to model the behavior of analog circuitry and digital circuitry, but also allow integration of existing digital designs with analog designs without the need to rewrite the individual designs. For example, Verilog-AMS handles a cross domain connection within a mixed-signal circuit design (e.g., connections between an analog net segment and a digital net segment) by automatically or manually inserting a connect module at the connection point. By doing so, the analog net and digital net are effectively partitioned, allowing each net to be simulated in its respective domain—the analog net in the continuous domain, and the digital net in the discrete domain. Typically, nets in the continuous domain are simulated using a differential equation kernel that calculates at discrete points in time solutions to a set of differential equations. Nets in the discrete domain, on the other hand, are simulated using a discrete event kernel that calculates discrete signal behavior based on events at discrete points in time. Meanwhile, the connect module, usually comprising an analog port connected to the analog net and a digital port connected to the digital net, is charged with converting signals crossing between the two nets. Specifically, the connect module converts the digital logic value from the digital net to an analog voltage for the analog net, or converts an analog voltage from the analog net to a digital logic value for the digital net.

Figure 1:
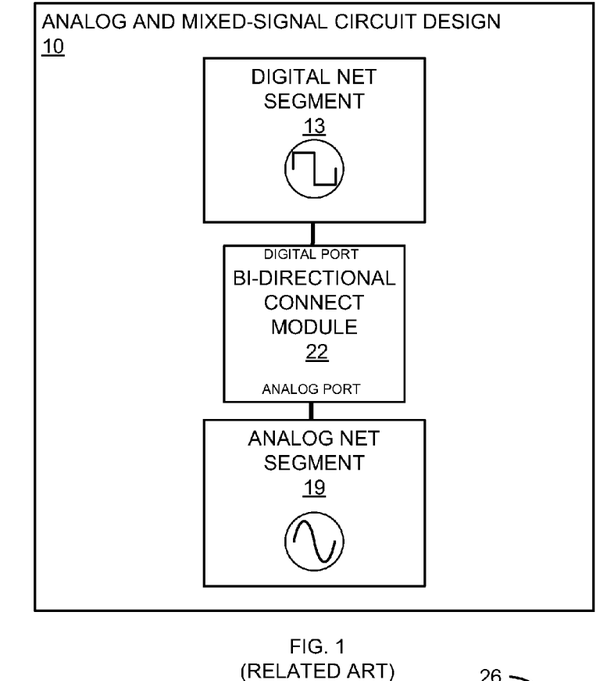
FIG. 1 illustrates an example analog and mixed-signal circuit design utilizing a bi-directional connect module to connect a digital net segment with an analog net segment.

In some cases, a special connect module called a bi-directional (e.g., BiDir) connect module is utilized to connect an analog net and a digital net together at a bi-directional connection point. As the name suggests, a bi-directional connect module is capable of converting cross domain signals (e.g., analog voltage to digital logic value, digital logic value to analog voltage) regardless of the direction in which they pass (e.g., from the digital net to the analog net, or vice versa). FIG. 1 illustrates just such a configuration, where analog and mixed-signal circuit design 10 utilizes a bi-directional connect module 22 to connect a digital net segment 13 with an analog net segment 19. As illustrated, the bi-directional connect module 22 not only connects the digital net 13 and analog net 19, but also provides segregation of the net segments for simulation purposes. The bi-directional connect module may be further configured to convert in both directions simultaneously at any specific time during simulation.

Figure 2A:
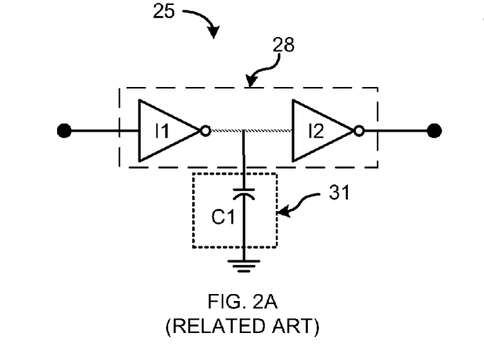
FIGS. 2A and 2B illustrate an example analog and mixed-signal circuit design before and after driver-receiver segregation.
Figure 2B:
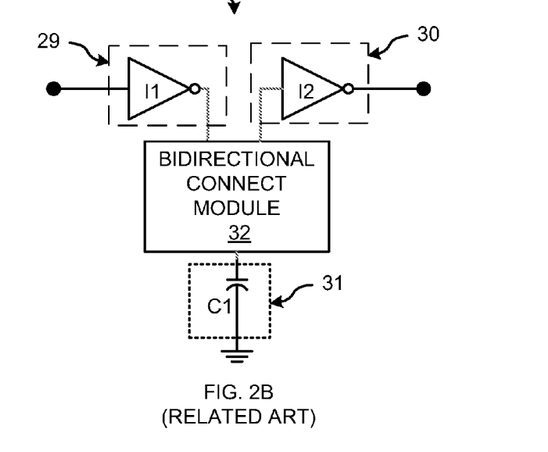

In order for a bi-directional connect module to properly account for the influences of an analog net on a digital net, a bi-directional connect module connecting the two nets would implement the concept of driver-receiver segregation (DRS) during mixed-signal simulation. Essentially, during simulation of the analog and mixed-signal circuit design using the driver-receiver segregation, drivers and receivers of a digital network (or digital net) connected to the digital port of a bi-directional connect module are segregated into two net segments with no direct link between them. One segment is (a) a driver net segment (e.g., driver digital network) connected to digital input port of the bi-directional connect module and comprising the drivers of the digital network; the other segment is (b) a receiver net segment (e.g., receiver digital network) connected to the digital output port of the bi-directional connect module and comprising the receivers of the digital network. By doing so, the bi-directional connect module during mixed-signal simulation can control the link between the driver net segment and receiver net segment such that the contributions of the analog net can be properly and accurately accounted for in the behavior of the digital net. FIGS. 2A and 2B illustrate how driver-receiver segregation is typically utilized in simulation of an example analog and mixed-signal circuit.

FIG. 2A illustrates an example analog and mixed-signal circuit 25 comprising two inverters (11 and 12) modeled in the digital (e.g., discrete) domain, and a capacitor modeled in the analog (e.g., continuous) domain. The two inverters comprise digital net segment 28, while the capacitor comprises analog net segment 31. Typically, during simulation, a connect module would be inserted between segment 28 and segment 31, thereby partitioning the two circuit segments and allowing them to be simulated in their respective domains. However, without the use of driver-receiver segregation, as described above, the simulation of the circuit will produce an unexpected and incorrect result. In this specific instance, because the inverters are modeled in the digital domain, and know nothing about the presence of the analog domain due to the net segregation, the digital simulation kernel will propagate a signal from the first inverter I1 to the second inverter I2 without accounting for the signal delay induced by the presence of capacitor C1.

FIG. 2B illustrates example analog and mixed-signal circuit 25 after insertion of a bi-directional connect module 32 between digital net segment 28 and analog net segment 31, and driver-receiver segregation (DRS) of the digit net segment 28 into a driver net 29 comprising only I1, and a receiver net 30 comprising only I2. As depicted, the driver net 29 is connected to the digital input port of module 32, while receiver net 30 is connected to the digital output port of module 32. By doing so, the connect module 32 is able to propagate the signal from the driver net 29 to the receiver net 30 with the delay attributed from analog net 31. It should be noted that conventionally, during analog and mixed-signal simulation (even under driver-receiver segregation) (a) the bi-directional connect module performs digital and analog signal resolution (e.g., cross-domain signal conversion) between the analog circuit segment and the digital circuit segment; and (b) the transmission gate network remains unaware of the existence of the one or more bi-directional connect modules connected to it.

Unfortunately, when a bi-directional connect module is used in conjunction with a transmission gate network (e.g., Verilog trangate network) comprising one or more transmission gates (e.g., Verilog tran gates, also known simply as trangates), issues exist relating to achieving accurate results during analog and mixed-signal simulation. This is particularly true when both an analog net segment and a digital transmission gate network of a digital net segment provide a driving force to the connect module. At least one reason for this problem is the inadequate protocol definition for interactions between the analog circuit and the transmission gate network using a bi-directional connect module.

BRIEF SUMMARY OF EMBODIMENTS OF THE INVENTION

The present invention provides systems and methods for simulating an analog and mixed-signal circuit design comprising an analog circuit segment and a transmission gate network of a digital circuit segment such that the simulation results in accurate results. Specifically, according to various embodiments of the invention, systems and methods are provided for simulating an analog and mixed-signal circuit design comprising an analog circuit segment and a transmission gate network of a digital circuit segment where the analog circuit segment is connected to the transmission gate network using a bi-directional connect module, where the analog circuit segment contributes with its own driving force to the digital circuit segment as an equivalent to a driver, and where the digital circuit segment contributes with its own driving force to the analog circuit segment. Further, in some embodiments of the present invention, the analog and mixed-signal circuit is simulated such that the bi-directional connect module defers to the transmission gate network any resolution of digital logic values to analog voltages, and any resolution of analog voltages to digital logic values. As understood within this description, one's own driving force is the force contributed by a circuit segment which does not include any portion of contribution from the other circuit segment. For instance, the driving force of the analog circuit is its driving force when not accounting for the digital circuit segment's contribution to the analog circuit segment.

In one embodiment, a method for simulating an analog and mixed-signal circuit design comprising an analog circuit segment and a digital circuit segment is provided, the method comprising: inserting a bi-directional connect module at a connection point between the analog circuit segment and a terminal of a transmission gate network, wherein the digital circuit segment comprises the transmission gate network, and the bi-directional connect comprises an analog port connected to the analog circuit segment, and a digital port connected to the transmission gate network; and when simulating the analog and mixed-signal circuit, evaluating the bi-directional connect module and the transmission gate network such that the analog circuit segment contributes an analog driving force to the transmission gate network as a digital driver, and the transmission gate network contributes a digital driving force to the analog circuit segment as an analog driver. In some such embodiments, the bi-directional connect module defers to the transmission gate network resolution of an analog signal to a digital logic value and resolution of a digital logic value to an analog signal. Additionally, in some such embodiments, the method repeats for each connection point in the analog and mixed-signal circuit where an analog circuit segment connects to a transmission gate network of a digital circuit segment. Particular embodiments of the present invention may also be implemented in various hardware description language (HDL). For example, the method may be configured for Verilog-AMS, the bi-directional connect module is an AMS BiDir connect module, and the transmission gate is a Verilog tran gate.

In various embodiments, evaluating the bi-directional connect module and the transmission gate network comprises: segregating the transmission gate network into a driver network and a receiver network, wherein the driver network comprises a digital driver terminal T_out and the receiver network comprises a digital receiver terminal T_in and segregating the digital port of the bi-directional connect module such that a digital output port of the bi-directional connect module is connected to T_in, and a digital input port of the bi-directional connect module is connected to T_out.

Depending on the embodiment, evaluating the bi-directional connect module and the transmission gate network may further comprise the bi-directional connect module performing the operations of: determining the analog driving force that the analog circuit segment contributes to the bi-directional connect module through the analog port; and outputting the analog driving force to T_in through the digital output port. In some embodiments, determining the analog driving force may comprise: reducing the analog circuit segment to an equivalent circuit comprising a voltage source in series with a resistor, and determining the analog driving force from the equivalent circuit. In other embodiments, the analog driving force may be determined by analyzing a matrix utilized by an analog circuit solver evaluating the analog circuit segment.

Further, depending on the embodiment the bi-directional connect module and the transmission gate network may further comprise the transmission gate network performing the operations of: determining a first logic value that T_out would output if the analog circuit segment was not contributing an analog driving force to the transmission gate network through the digital output port of the bi-directional connect module; outputting the first logic value to the digital input port through T_out, thereby contributing the digital driving force to the analog circuit segment through the bidirectional connect module; and determining a second logic value that T_out would output after accounting for the analog driving force from the digital output port.

In additional embodiments, the transmission network comprises a first set of N terminals Tn having a first subset of M terminals Tm connected one-to-one to a second set of M bi-directional connect modules Bm, where $M \leq N$, and wherein evaluating the bi-directional connect module and the transmission gate network comprises: adding a transmission gate TGm to the transmission gate network for each terminal Tm of the first set, wherein each TGm is inserted between a terminal Tm of the first subset and a bi-directional connect module Bm of the second set; segregating the transmission gate network into a driver network and a receiver network such that: the driver network comprises driver transmission gates TGm_d of TGm, the receiver network comprises receiver transmission gates TGm_r of TGm, each driver transmission gate TGm_d comprises an input terminal TGm_d_in connected to an output terminal Tm_out of Tm and an output terminal TGm_d_out connected to a digital input port of a bi-directional connect module Bm, and each receiver transmission gate TGm_r comprises an input terminal TGm_r_in connected to a digital output port of a bi-directional connect module Bm and an output terminal TGm_r_out connected to an input terminal Tm_in of Tm; evaluating each Bm, for m=1 to M, such that it does not perform digital resolution or analog resolution; evaluating each TGm_d_out, for m=1 to M, as a function of Tx_in for x=1 to N, and TGy_r_in for y=1 to M, while enforcing high impedance Z on TGm_r_in; and evaluating each Tm_out, for m=1 to M, as a function of Tx_in for x=1 to N, and TGy_r_in for y=1 to M. In further such embodiments, each transmission gate TGm may always be on and may preserve signal strength as signals pass through.

In other embodiments, the methods as described above are implemented into a computer aided design tool, such as an electronic design and automation (FDA) tool, comprising: a processor; and a memory, coupled to the processor and having computer program code embodied therein for enabling the processor to perform operations in accordance with those methods described herein. In alternative embodiments, some embodiments in accordance with above provide for a computer program product comprising a computer useable storage medium having computer program code embodied therein for simulating an analog and mixed-signal circuit design comprising an analog circuit segment and a digital circuit segment in accordance with aspects of the invention described herein.

Other features and aspects of the invention will become apparent from the following detailed description, taken in conjunction with the accompanying drawings, which illustrate, by way of example features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward systems and methods for simulating an analog and mixed-signal circuit design comprising an analog circuit segment and a transmission gate network of a digital circuit segment, where the analog circuit segment contributes an analog driving force to the transmission gate network as a digital driver, and the transmission gate network contributes a digital driving force to the analog circuit segment as an analog driver. Various embodiments of the present invention aim to solve issues related to using, within a mixed-signal circuit, a bi-directional connect module to connect an analog circuit to a transmission gate network of a digital circuit, especially in cases where both the analog circuit and the digital transmission gate network contribute a driving force to the bi-directional connect module during simulation. Particular embodiments of the present invention provide systems and methods that furnish proper bi-directional connects between analog circuits and digital transmission gate networks during simulation of an analog and mixed-signal circuit design.

Figure 3:
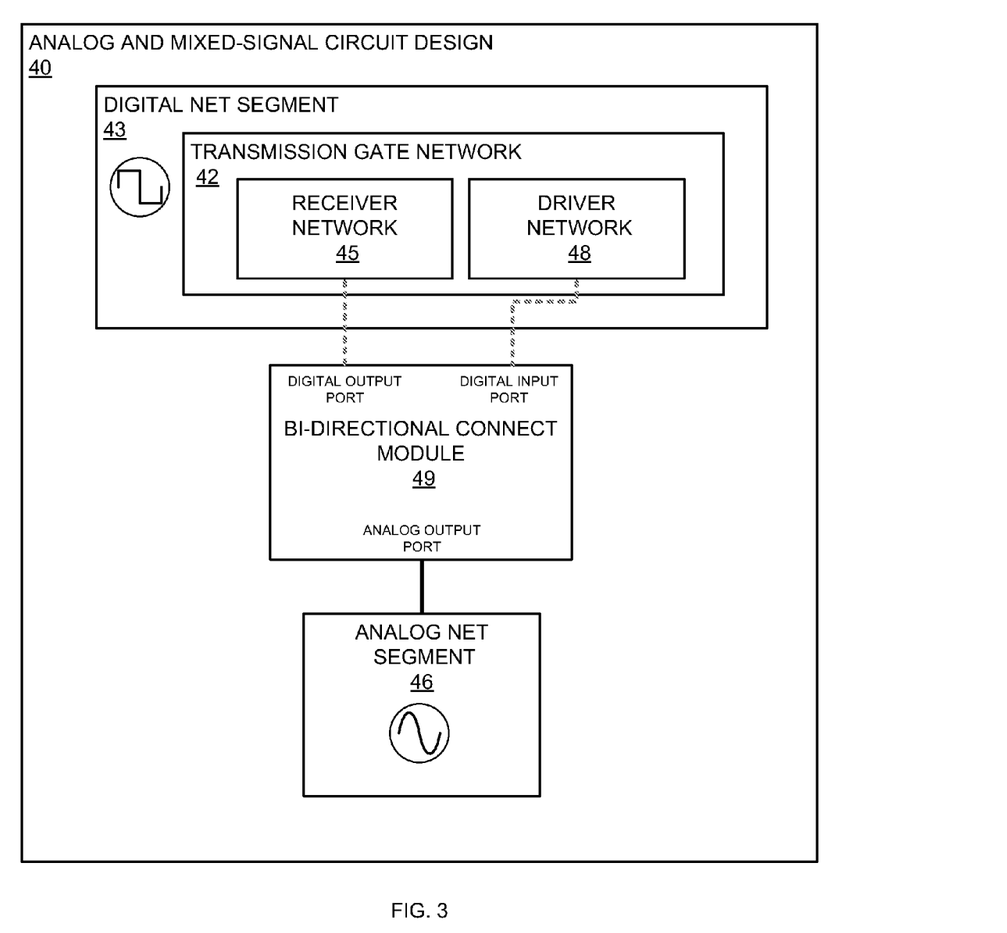
FIG. 3 illustrates an example analog and mixed-signal circuit design utilizing a bi-directional connect module to connect a transmission gate network with an analog net segment.

Referring now to the drawings, FIG. 3 provides a diagram of an example analog and mixed-signal circuit design 40 in which various methods in accordance with the present invention may be utilized. In accordance with an embodiment, analog and mixed-signal circuit design 40 utilizes a bi-directional connect module 49 to connect a transmission gate network 42 of a digital net segment 43 to an analog net segment 46. As illustrated, during simulation of the circuit design 40 in accordance with an embodiment of the invention, the transmission gate network 42 is segregated into a network of receivers 45 of transmission gate network 42, and a network of drivers (also known simply as a receiver network and driver network, respectively). Also shown is how, after driver-receiver segregation of transmission gate network 42, the receiver network 45 is connected to a digital output port of bi-directional connect module 49, and the driver network 48 is connected to a digital input port of bi-directional connect module 49. As previously described, by performing such driver-receiver segregation (DRS) during analog and mixed-signal circuit simulation, the contributions of the analog net segment 46 can be properly and accurately accounted for in the behavior of the transmission gate network 42 of the digital net segment 43.

Figure 4A:
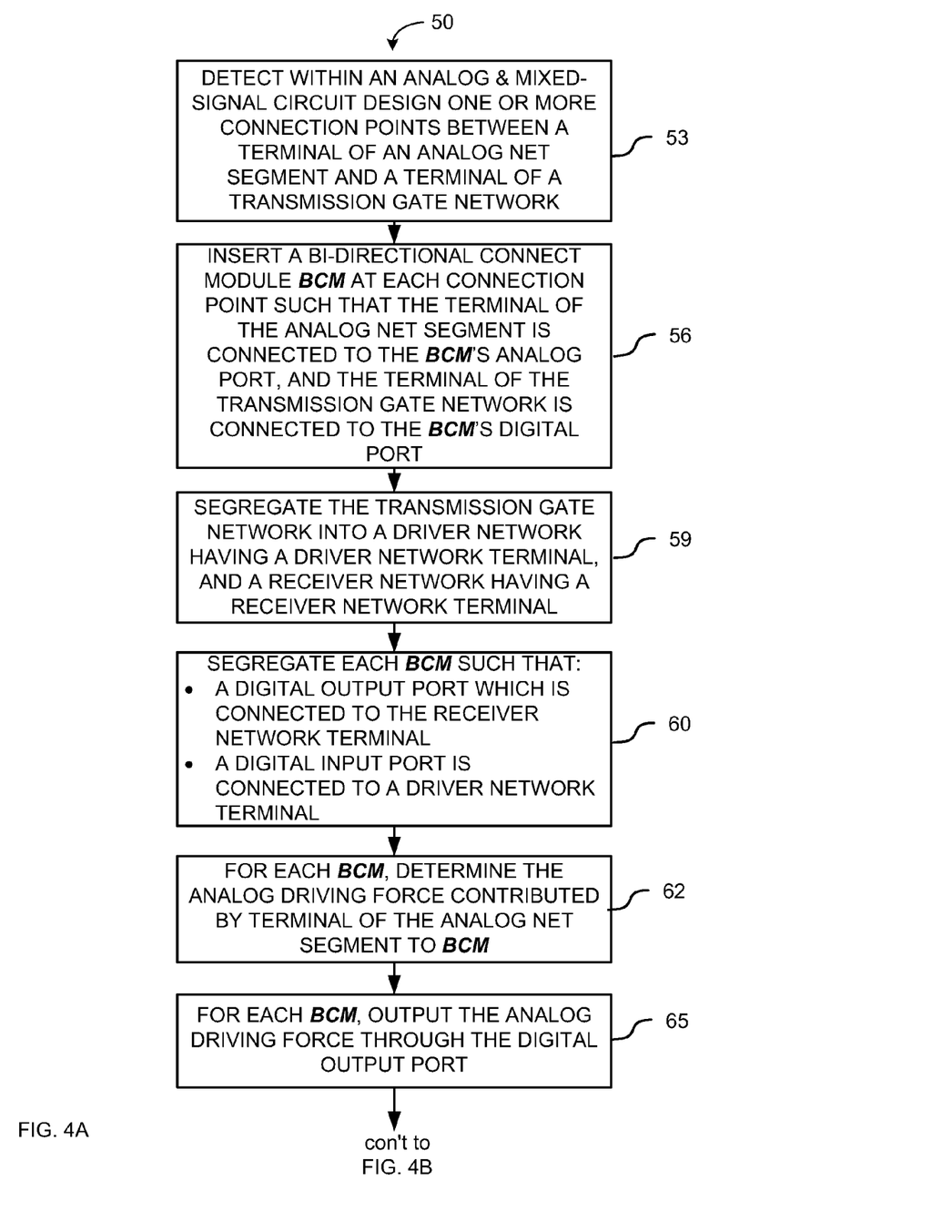
FIGS. 4A and 4B illustrate a flowchart of an example method in accordance with one embodiment of the invention.
Figure 4B:
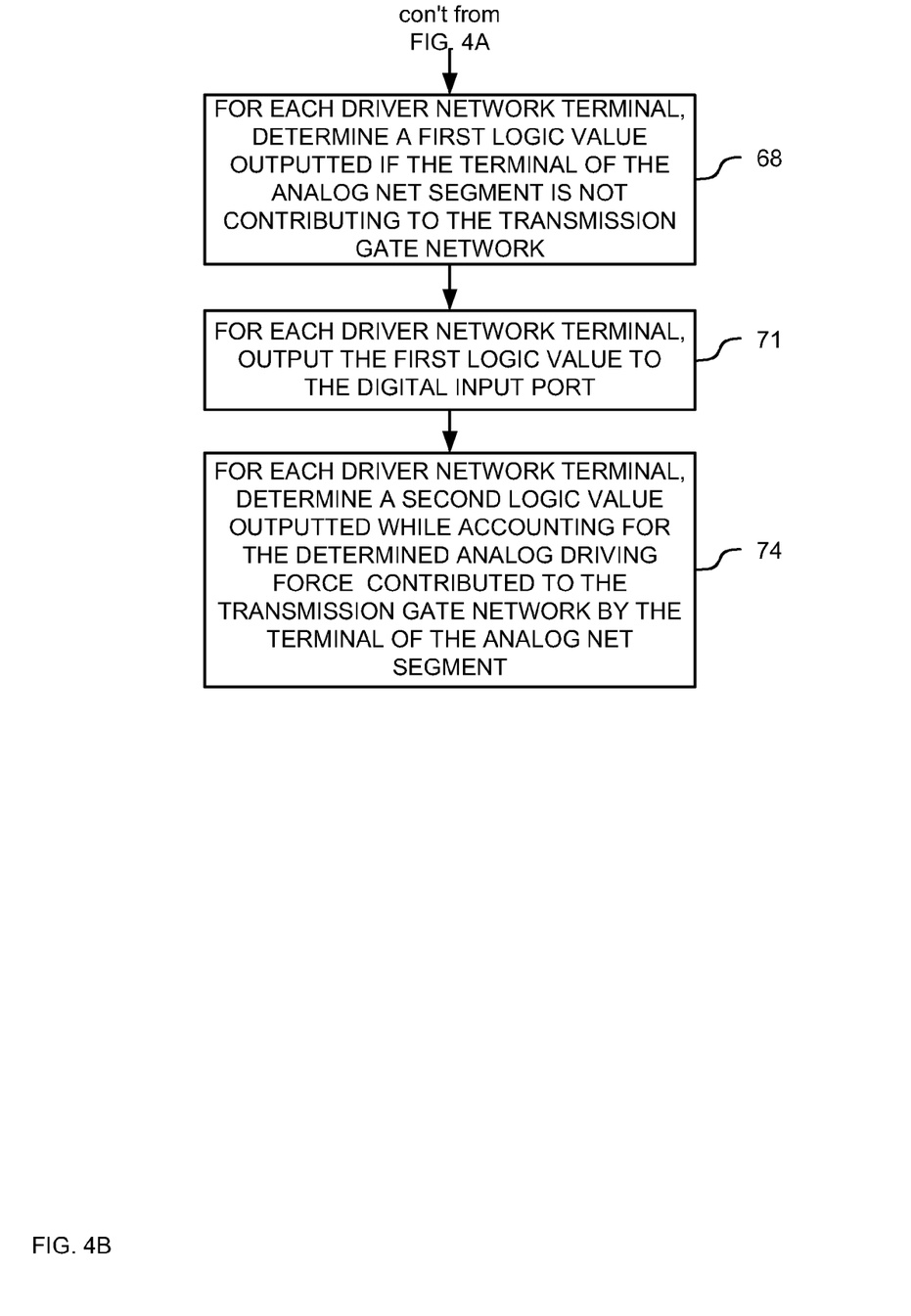

Turning now to FIGS. 4A and 4B, a flowchart is provided of an example method 50 in accordance with one embodiment of the invention. Method 50 highlights one approach under the invention for achieving proper interaction between an analog net segment and the transmission gate network and, more specifically, for the analog circuit segment to contribute its own driving force to the transmission gate network as an equivalent to a driver on the digital net, and the transmission gate network contributing its own driving force to the analog net segment as a driver on the analog net. Again, as earlier described, one's own driving force throughout this description generally refers to the driving force, and it should not include any portion of the contribution that the other party makes to it (e.g., the analog net's driving force should not include contributions from the digital net, and the digital net's driving force should not include contributions from the analog net).

The method 50 begins at operation 53 with the detection of connection points, within an analog and mixed-signal circuit, between terminals of an analog net segment (Or circuit segment) and terminals of a transmission gate network of a digital net segment. Depending on the embodiment, operation 53 may commence at any time during the simulation of an analog and mixed-signal circuit.

At operation 56, method 50 continues by inserting a bi-directional connect module BCM at each connection point detected during operation 53. Each bi-directional connect module BCM inserted comprises an analog port, connected to the terminal of the analog net segment at the connection point, and a digital port, connected to the terminal of the transmission gate network at the connection point. At the conclusion of operation 56, the analog net segment is effectively partitioned from the transmission gate network by bi-directional connect modules BCM.

Upon completion of operation 56, the transmission gate network is segregated in operation 59 into a network of drivers of the transmission gate network, and a network of receivers of the transmission gate network, the interface points for the two networks being a driver network terminal and a receiver network terminal, respectively. As a consequence of this segregation, each bi-directional connect module BCM is also segregated in operation 60, with each BCM now having two digital ports in place of the one. Specifically, one port is a digital output port connected to the receiver network terminal of the new receiver network, while the other port is a digital input port connected to the driver network terminal of the new driver network.

Starting with operation 62, method 50 begins to evaluate the transmission gate network and each bi-directional connect module BCM for the purpose of simulating behavior of the analog and mixed-signal circuit design. First, in operation 62, method 50 determines the analog driving force contributed by each analog net segment to each corresponding bi-directional connect module BCM through the terminal of the analog net segment. For example, method 50 may determine the analog driving force by analyzing the matrix used by an analog circuit solver (of an analog and mixed-signal simulator) when evaluating the analog net segment. In another example, method 50 may determine the analog driving force by first reducing the analog net segment into an equivalent circuit comprising a voltage source in series with a resistor and, then, determining the analog driving force from the equivalent circuit. Once determined for each terminal of the analog net segment, the driving force for each analog net segment terminal is outputted to a corresponding receiver network terminal via the bi-directional connect module BCM's digital output port (operation 65). In addition, in some embodiments, the bi-directional connect module BCM performs this output while deferring cross-domain resolution of the (analog) driving force to a digital logic value; this resolution is left for the transmission gate network to perform.

Turning now to FIG. 4B, method 50 continues with operation 68, where for each driver network terminal, a first (digital) logic value is determined as if each terminal of the analog net segment is not contributing to the transmission gate network (e.g., as if each receiver network terminal is not receiving an analog driving force). This first logic value is outputted into the digital input port at operation 71. This followed by operation 74 where, for each driver network terminal, a second (digital) logic value is determined while accounting for the analog driving force contributed by the terminal of the analog segment to the transmission gate network (e.g., while accounting for the analog driving force received by each receiver network terminal). It should be noted that the first and second digital logic values outputted through the analog port by the bi-directional connect module BCM is the actual resolution of the driving forces produced by each driver network terminal.

In various embodiments, method 50 and variations thereof may be implemented into analog and mixed-signal circuit simulators by a variety of means, including but not limited to hardware descriptor languages, such as Verilog, VHDL, and the analog and mixed-signal (AMS) extensions thereof (e.g., Verilog-AMS and VHDL-AMS, respectively).

Figure 5A:
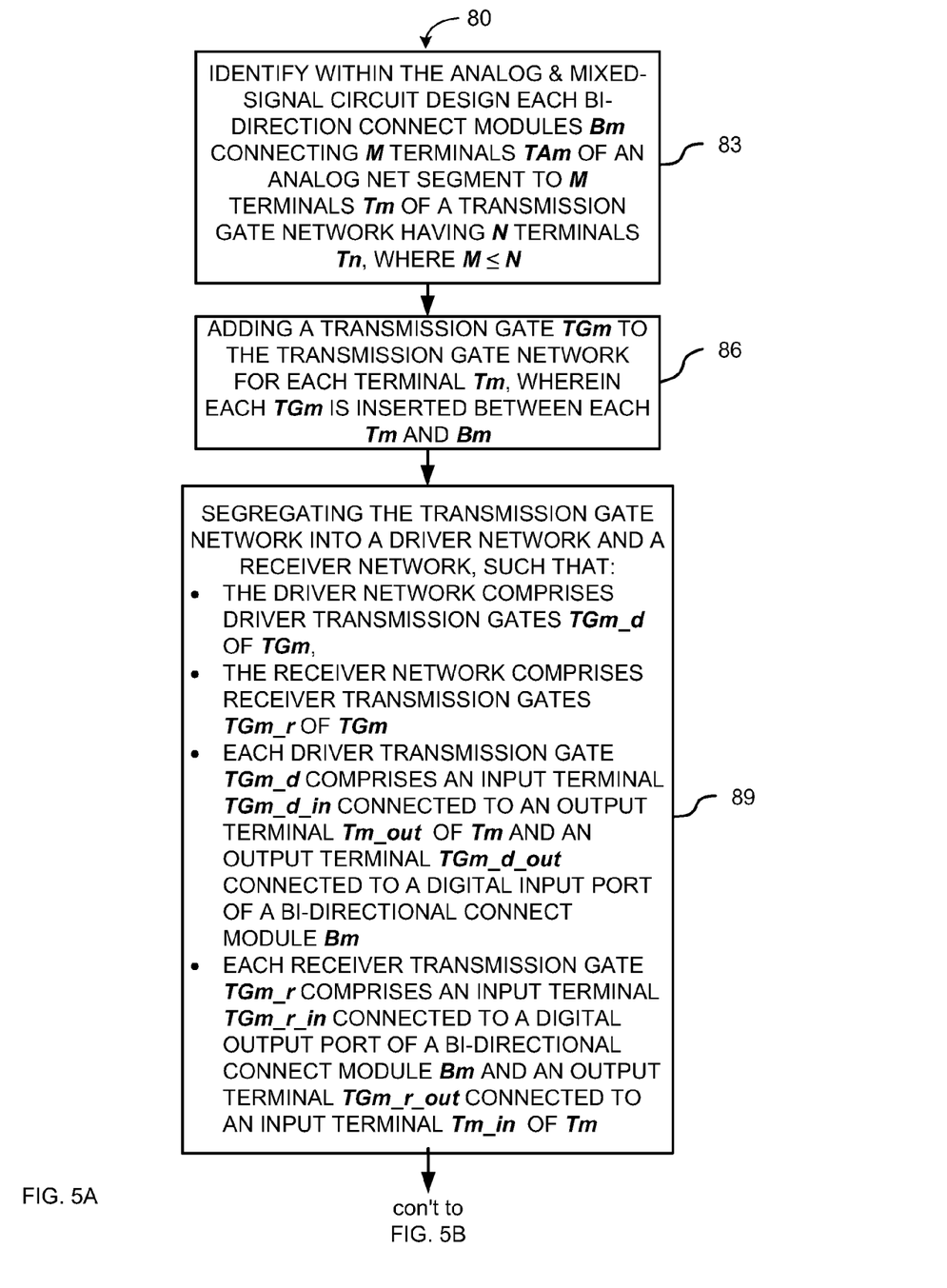
FIGS. 5A and 5B illustrate a flowchart of an example method in accordance with one embodiment of the invention.
Figure 5B:
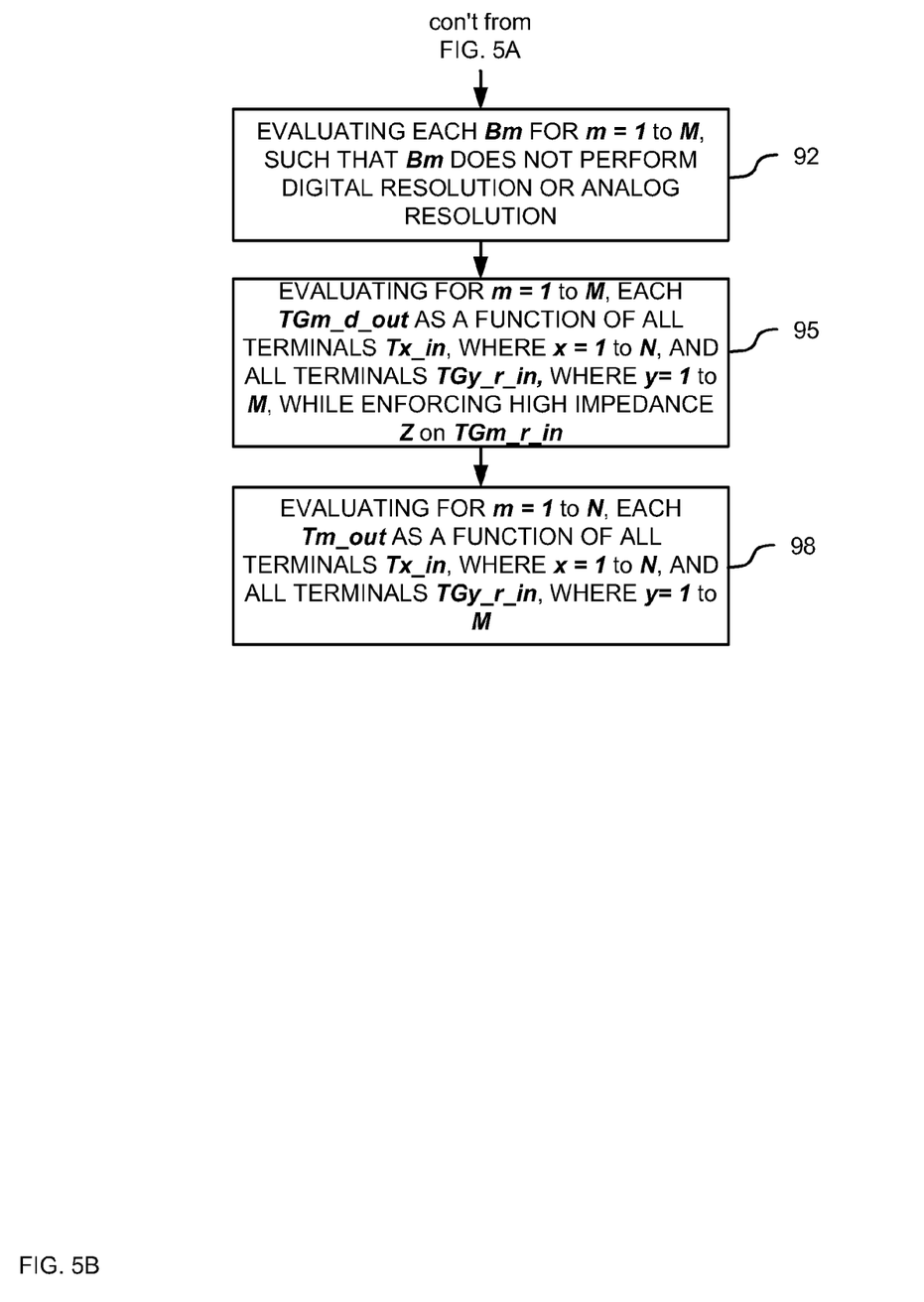

FIGS. 5A and 5B provide a flowchart of method 80 in accordance with another embodiment of the invention that also can be implemented into analog and mixed-signal circuit simulators by a variety of means, including any hardware descriptor language. Method 80 begins under the assumption that a set of bi-directional connect modules Bm has already been inserted into an analog and mixed-signal circuit design such that the set connects M terminals TAm of an analog net segment to M terminals Tm of a transmission network having N terminals, where M≦N. As such, method 80 starts at operation 83 by identifying the set of bi-directional connect modules Bm. Method 80 proceeds by adding a transmission gate TGm to each terminal Tm at operation 86, where each TGm is inserted between each Tm and corresponding Bm.

Next, the transmission gate network is segregated into a driver network and a receiver network at operation 89. The results of this driver-receiver segregation are two digital networks: one is a driver network comprising driver transmission gates TGm_d connected to terminals Tm_out, and the other is a receiver network comprising receiver transmission gates TGm_r connected to terminals Tm_in, Effectively, by segregating the transmission gate network into two digital networks, and the newly added transmission gates TGm have also been segregated into driver transmission gates TGm_d and receiver transmission gates TGm_r, and the terminals Tm of the original transmission gate network have also been segregated into terminals Tm_out of the driver network, and terminals Tm_in of the receiver network. Accordingly, each driver transmission gate TGm_d comprises an input terminal TGm_din connected to an output terminal Tm_out of the driver network, and an output terminal TGm_d_out connected to a digital input port of a bi-directional connect module Bm; and each receiver transmission gate TGm_r comprises an input terminal TGm_r_in connected to a digital output port of a bi-directional connect module Bm and an output terminal TGm_r_out connected to an input terminal Tm_in of the receiver network.

Referring now to FIG. 5B, method 80 continues with operation 92, where each Bm for m=1 to M, is evaluated such that Bm does not perform digital or analog resolution. As a result, during evaluation each Bm passes on the driving force contributed by one domain segment onto the other domain segment (e.g., analog net segment's driving force to the digital net segment, and vice versa). Next, in operation 95, for m=1 to M, method 80 individually evaluates each TGm_d_out, as a function of all terminals Tx_in, where x=1 to N, and all terminals TGy_r_in where y=1 to M, while high impedance Z is enforced on TGm_in. With the high impedance enforced on TG_r_in, method 80 effectively eliminates the influence of the terminal TAm of analog net segment on determining the digital logic value outputted by a corresponding driver network terminal Tm_out during operation 95.

In its final operation (98), method 80 concludes with the evaluation of each Tm_out, for m=1 to N, as a function of all terminals Tx_in, where x=1 to N, and all terminals TGy_r_in, where y=1 to M. By performing this evaluation, method 80 has determined the output of the driver network while accounting for the contributions/influences of the terminals TAm of the analog segment on corresponding receiver network terminal Tm_in.

As previously noted, methods in accordance with those described above can readily be implemented into a simulator using hardware descriptor languages. For example, in the Verilog-AMS, each transmission gate could be implemented as a tran gate instance (also known simply as a trangate), which would be added to the analog and mixed-signal circuit design such that the tran gate connects each bi-directional connect module to a transmission gate terminal. In such an implementation, the Verilog tran gate would always be on, maintain the strength of the signals that pass through it, and be recorded in the circuit design as having special terminals. Additionally, a Verilog BiDir connect module could be utilized for the bi-directional connect module, however would need to be modified such that it does not perform digital or analog resolution.

With respect to some of the evaluation operations using extra transmission gates, Verilog can utilize some of its features, such as local queues, to properly evaluate output terminals in accordance with methods described above. For example, in order to implement operations 83-98 of method 80 in Verilog for a trangate network having N terminals of which M terminals (e.g., T1, T2, . . . , TM) are connected one-to-one to a M BiDir connect module, in the elaboration stage the following operations can occur: (1) for each of the terminals T1, T2, . . . , TM, an extra trangate (e.g. Verilog tran gate) is added and connected to the net that the terminal TM is connected to, thereby expanding the trangate network with M new terminals T1', T2', . . . , TM'; (2) for the BiDir instances that are connected to terminals T1, . . . , TM, connect them to terminals T1', T2', . . . , TM' instead, such that that the input ports of the BiDir connect modules are connected to the outputs of the terminals (e.g., TM'_out), and the output ports of the BiDir connect modules are connected to the inputs of the terminals (e.g., TM'_out); and (3) record terminals T1', T2', . . . , TM' as special terminals. Then, when the trangate network needs to be evaluated, the following methods can be scheduled in the local queue of the trangate network:

Method 1: {T1'_out}=NewTranF(T1'_in, T2'_in, . . . , TM'_in, T1_in, T2_in, . . . , TM_in, . . . , TN_in), where T1'_in=Z is enforced Method 2: {T2'_out}=NewTranF(T1'_in, T2'_in, . . . , TM'_in, T1_in, T2_in, . . . , TM_in, . . . , TN_in), where T2'_in=Z is enforced Method M: {TM'_out}=NewTranF(T1'_in, T2'_in, . . . , TM'_in, T1_in, T2_in, . . . , TM_in, . . . , TN_in), where Tm'_in=Z is enforced Method M+1: {T1_out, T2_out, . . . , TM_out, . . . , TN_out}=NewTranF(T1'_in, T2'_in, . . . , TM'_in, T1_in, T2_in, . . . , TM_in, . . . , TN_in)

As used herein, the term set may refer to any collection of elements, whether finite or infinite. The term subset may refer to any collection of elements, wherein the elements are taken from a parent set; a subset may be the entire parent set. The term proper subset refers to a subset containing fewer elements than the parent set. The term sequence may refer to an ordered set or subset. The terms less than, less than or equal to, greater than, and greater than or equal to, may be used herein to describe the relations between various objects or members of ordered sets or sequences; these terms will be understood to refer to any appropriate ordering relation applicable to the objects being ordered.

The term tool can be used to refer to any apparatus configured to perform a recited function. For example, tools can include a collection of one or more modules and can also comprise of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 6:
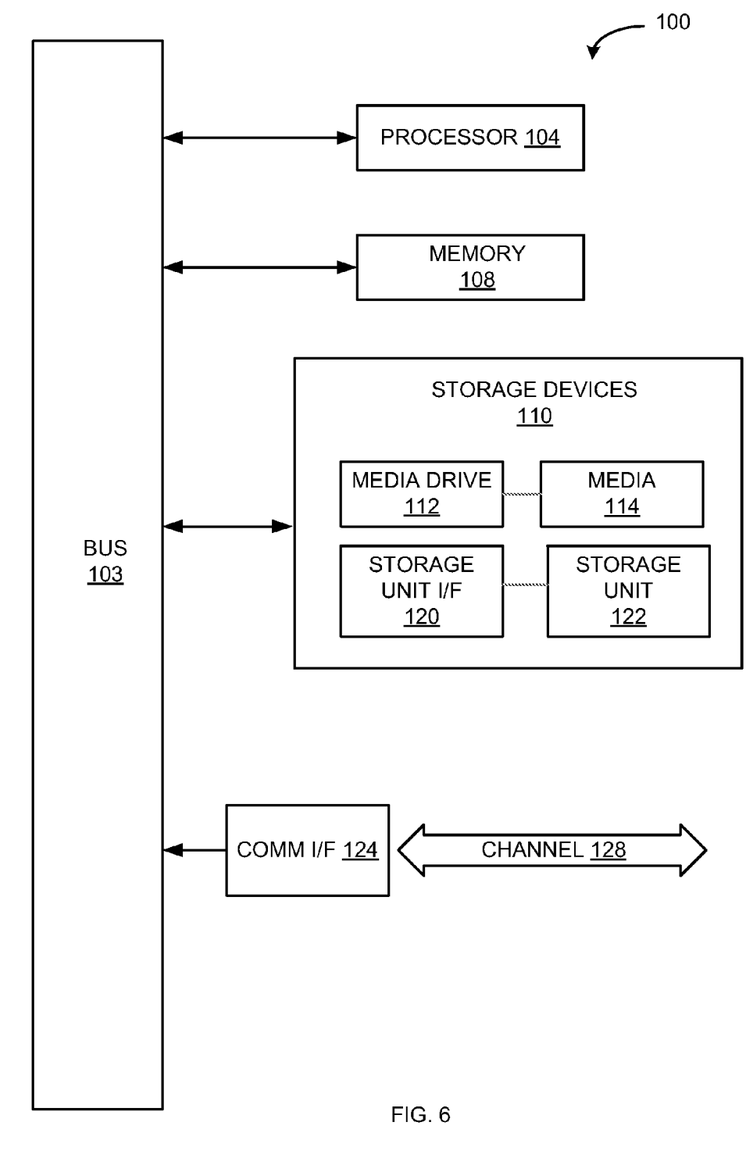
FIG. 6 illustrates an example computing module for implementing various embodiments of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules, or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example of a computing module is shown in FIG. 6. Various embodiments are described in terms of this example-computing module 100. After reading this description, it will become apparent to an ordinary person skilled in the relevant art how to implement the invention using other computing modules or architectures.

Referring now to FIG. 6, computing module 100 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 100 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 100 might include, for example, one or mare processors, controllers, control modules, or other processing devices, such as a processor 104. Processor 104 might be implemented using a general-purpose or special-purpose processing engine such as, for example, a microprocessor, controller, or other control logic. In the illustrated example, processor 104 is connected to a bus 102, although any communication medium can be used to facilitate interaction with other components of computing module 100 or to communicate externally.

Computing module 100 might also include one or more memory modules, simply referred to herein as main memory 108. For example, preferably random access memory (RAM) or other dynamic memory, might be used for storing information and instructions to be executed by processor 104. Main memory 108 might also be used for storing temporary variables or other intermediate information during execution of instructions to be executed by processor 104. Computing module 100 might likewise include a read only memory ("ROM") or other static storage device coupled to bus 102 for storing static information and instructions for processor 104.

The computing module 100 might also include one or more various forms of information storage mechanism 110, which might include, for example, a media drive 112 and a storage unit interface 120. The media drive 112 might include a drive or other mechanism to support fixed or removable storage media 114. For example, a hard disk drive, a floppy disk drive, a magnetic tape drive, an optical disk drive, a CD or DVD drive (R or RW), or other removable or fixed media drive might be provided. Accordingly, storage media 114 might include, for example, a hard disk, a floppy disk, magnetic tape, cartridge, optical disk, a CD or DVD, or other fixed or removable medium that is read by, written to or accessed by media drive 112. As these examples illustrate, the storage media 114 can include a computer usable storage medium having stored therein computer software or data.

In alternative embodiments, information storage mechanism 110 might include other similar instrumentalities for allowing computer programs or other instructions or data to be loaded into computing module 100. Such instrumentalities might include, for example, a fixed or removable storage unit 122 and an interface 120. Examples of such storage units 122 and interfaces 120 can include a program cartridge and cartridge interface, a removable memory (for example, a flash memory or other removable memory module) and memory slot, a PCMCIA slot and card, and other fixed or removable storage units 122 and interfaces 120 that allow software and data to be transferred from the storage unit 122 to computing module 100.

Computing module 100 might also include a communications interface 124. Communications interface 124 might be used to allow software and data to be transferred between computing module 100 and external devices. Examples of communications interface 124 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 124 might typically be carried on signals, which can be electronic, electromagnetic (which includes optical) or other signals capable of being exchanged by a given communications interface 124. These signals might be provided to communications interface 124 via a channel 128. This channel 128 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 108, storage unit 120, media 114, and channel 128. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 100 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for simulating an analog and mixed-signal circuit design comprising an analog circuit segment and a transmission gate network of a digital circuit segment, the method comprising:
   inserting a bi-directional connect module at a connection point between the analog circuit segment and a terminal of a transmission gate network, wherein the bi-directional connect module comprises an analog port connected to the analog circuit segment, and a digital port connected to the transmission gate network; and
   when simulating the analog and mixed-signal circuit, evaluating the bi-directional connect module and the transmission gate network such that the analog circuit segment contributes an analog driving force to the transmission gate network as a digital driver, and the transmission gate network contributes a digital driving force to the analog circuit segment as an analog driver,
   wherein the transmission gate network comprises a first set of N terminals Tn having a first subset of M terminals Tm connected one-to-one to a second set of M bi-directional connect modules Bm, where M≦N, and
   wherein evaluating the bi-directional connect module and the transmission gate network comprises:
      adding a transmission gate TGm to the transmission gate network for each terminal Tm of the first set, wherein each TGm is inserted between a terminal Tm of the first subset and a bi-directional connect module Bm of the second set;
      segregating the transmission gate network into a driver network and a receiver network such that:
         the driver network comprises driver transmission gates TGm_d of TGm,
         the receiver network comprises receiver transmission gates TGm_r of TGm,
         each driver transmission gate TGm_d comprises an input terminal TGm_d_in connected to an output terminal Tm_out of Tm and an output terminal TGm_d_out connected to a digital input port of a bi-directional connect module Bm, and
         each receiver transmission gate TGm_r comprises an input terminal TGm_r_in connected to a digital output port of a bi-directional connect module Bm and an output terminal TGm_r_out connected to an input terminal Tm_in of Tm;
      evaluating each Bm, for m=1 to M, such that it does not perform digital resolution or analog resolution;
      evaluating each TGm_d_out, for m=1 to M, as a function of Tx_in for x=1 to N, and TGy_r_in for y=1 to M, while enforcing high impedance Z on TGm_r_in; and
      evaluating each Tm_out, for m=1 to M, as a function of Tx_in for x=1 to N, and TGy_r_in for y=1 to M.

2. The method of claim 1, wherein evaluating the bi-directional connect module and the transmission gate network comprises:
   segregating the transmission gate network into a driver network and a receiver network, wherein the driver network comprises a digital driver terminal T_out and the receiver network comprises a digital receiver terminal T_in; and
   segregating the digital port of the bi-directional connect module such that a digital output port of the bi-directional connect module is connected to T_in, and a digital input port of the bi-directional connect module is connected to T_out.

3. The method of claim 2, wherein evaluating the bi-directional connect module and the transmission gate network further comprises the bi-directional connect module performing the operations of:
   determining the analog driving force that the analog circuit segment contributes to the bi-directional connect module through the analog port; and
   outputting the analog driving force to T_in through the digital output port.

4. The method of claim 2, wherein the bi-directional connect module and the transmission gate network further comprise the transmission gate network performing the operations of:
   determining a first logic value that T_out would output if the analog circuit segment was not contributing an analog driving force to the transmission gate network through the digital output port of the bi-directional connect module;
   outputting the first logic value to the digital input port through T_out, thereby contributing the digital driving force to the analog circuit segment through the bi-directional connect module; and
   determining a second logic value that T_out would output after accounting for the analog driving force from the digital output port.

5. The method of claim 3, wherein determining the analog driving force comprises:
   reducing the analog circuit segment to an equivalent circuit comprising a voltage source in series with a resistor, and determining the analog driving force from the equivalent circuit.

6. The method of claim 3, wherein the analog driving force is determined by analyzing a matrix utilized by an analog circuit solver evaluating the analog circuit segment.

7. The method of claim 1, wherein the method repeats for each connection point in the analog and mixed-signal circuit where an analog circuit segment connects to a transmission gate network of a digital circuit segment.

8. The method of claim 1, wherein the bi-directional connect module defers to the transmission gate network resolution of an analog signal to a digital logic value and resolution of a digital logic value to an analog signal.

9. The method of claim 1, wherein each transmission gate TGm is always on and preserves signal strength as signals pass through.

10. The method of claim 1, wherein the method is configured for Verilog-AMS, the bi-directional connect module is an AMS BiDir connect module, and the transmission gate is a Verilog tran gate.

11. A computer program product for simulating an analog and mixed-signal circuit design comprising an analog circuit segment and a transmission gate network of a digital circuit segment, the computer program product comprising a non-transitory computer-readable storage medium having computer-readable program code embodied in said medium, the computer-readable program code comprising:
   inserting a bi-directional connect module at a connection point between the analog circuit segment and a terminal of a transmission gate network, wherein the bi-directional connect module comprises an analog port connected to the analog circuit segment, and a digital port connected to the transmission gate network; and
   when simulating the analog and mixed-signal circuit, evaluating the bi-directional connect module and the transmission gate network such that the analog circuit segment contributes an analog driving force to the transmission gate network as a digital driver, and the transmission gate network contributes a digital driving force to the analog circuit segment as an analog driver, wherein the transmission gate network comprises a first set of N terminals Tn having a first subset of M terminals Tm connected one-to-one to a second set of M bi-directional connect modules Bm, where $M \leq N$, and wherein evaluating the bi-directional connect module and the transmission gate network comprises:

adding a transmission gate TGm to the transmission gate network for each terminal Tm of the first set, wherein each TGm is inserted between a terminal Tm of the first subset and a bi-directional connect module Bm of the second set;

segregating the transmission gate network into a driver network and a receiver network such that:

the driver network comprises driver transmission gates TGm_d of TGm, the receiver network comprises receiver transmission gates TGm_r of TGm, each driver transmission gate TGm_d comprises an input terminal TGm_d_in connected to an output terminal Tm_out of Tm and an output terminal TG_d_out connected to a digital input port of a bi-directional connect module Bm, and each receiver transmission gate TGm_r comprises an input terminal TGm_r_in connected to a digital output port of a bi-directional connect module Bm and an output terminal TGm_r_out connected to an input terminal Tm_in of Tm;

evaluating each Bm, for m=1 to M, such that it does not perform digital resolution or analog resolution;

evaluating each TGm_d_out, for m=1 to M, as a function of Tx_in for x=1 to N, and TGy_r_in for y=1 to M, while enforcing high impedance Z on TGm_r_in; and evaluating each Tm_out, for m=1 to M, as a function of Tx_in for x=1 to N, and TGy_r_in for y=1 to M.

12. The computer program product of claim 11, wherein evaluating the bi-directional connect module and the transmission gate network comprises the bi-directional connect module performing the operations of:

segregating the transmission gate network into a driver network and a receiver network, wherein the driver network comprises a digital driver terminal T_out and the receiver network comprises a digital receiver terminal T_in; and segregating the digital port of the bi-directional connect module such that a digital output port of the bi-directional connect module is connected to T_in, and a digital input port of the bi-directional connect module is connected to T_out.

13. The computer program product of claim 12, wherein evaluating the bi-directional connect module and the transmission gate network further comprises the bi-directional connect module performing the operations of:

determining the analog driving force that the analog circuit segment contributes to the bi-directional connect module through the analog port; and outputting the analog driving force to T_in through the digital output port.

14. The computer program product of claim 12, wherein the bi-directional connect module and the transmission gate network further comprise the transmission gate network performing the operations of:

determining a first logic value that T_out would output if the analog circuit segment was not contributing an analog driving force to the transmission gate network through the digital output port of the bi-directional connect module;

outputting the first logic value to the digital input port through T_out, thereby contributing the digital driving force to the analog circuit segment through the bi-directional connect module; and determining a second logic value that T_out would output after accounting for the analog driving force from the digital output port.

15. The computer program product of claim 11, wherein the method repeats for each connection point in the analog and mixed-signal circuit where an analog circuit segment connects to a transmission gate network of a digital circuit segment.

16. The computer program product of claim 11, wherein the bi-directional connect module defers to the transmission gate network resolution of an analog signal to a digital logic value and resolution of a digital logic value to an analog signal.

17. A system for simulating an analog and mixed-signal circuit design comprising an analog circuit segment and a transmission gate network of a digital circuit segment, the system comprising:

a processor;

a memory connected to the processor; and a computer readable medium having instructions embedded therein, the instructions configured to cause the processor to perform the operations of:

inserting a bi-directional connect module at a connection point between the analog circuit segment and a terminal of a transmission gate network, wherein the bi-directional connect module comprises an analog port connected to the analog circuit segment, and a digital port connected to the transmission gate network; and when simulating the analog and mixed-signal circuit, evaluating the bi-directional connect module and the transmission gate network such that the analog circuit segment contributes an analog driving force to the transmission gate network as a digital driver, and the transmission gate network contributes a digital driving force to the analog circuit segment as an analog driver, wherein the transmission gate network comprises a first set of N terminals Tn having a first subset of M terminals Tm connected one-to-one to a second set of M bi-directional connect modules Bm, where $M \leq N$, and wherein evaluating the bi-directional connect module and the transmission gate network comprises:

adding a transmission gate TGm to the transmission gate network for each terminal Tm of the first set, wherein each TGm is inserted between a terminal Tm of the first subset and a bi-directional connect module Bm of the second set;

segregating the transmission gate network into a driver network and a receiver network such that:

the driver network comprises driver transmission gates TGm_d of TGm, the receiver network comprises receiver transmission gates TGm_r of TGm, each driver transmission gate TGm_d comprises an input terminal TGm_d_in connected to an output terminal Tm_out of Tm and an output terminal TG_d_out connected to a digital input port of a bi-directional connect module Bm, and each receiver transmission gate TGm_r comprises an input terminal TGm_r_in connected to a digital output port of a bi-directional connect module Bm and an output terminal TGm_r_out connected to an input terminal Tm_in of Tm;

evaluating each Bm, for m=1 to M, such that it does not perform digital resolution or analog resolution;

evaluating each TGm_d_out, for m=1 to M, as a function of Tx_in for x=1 to N, and TGy_r_in for y=1 to M, while enforcing high impedance Z on TGm_r_in; and evaluating each Tm_out, for m=1 to M, as a function of Tx_in for x=1 to N, and TGy_r_in for y=1 to M.

18. The system of claim 17, wherein evaluating the bi-directional connect module and the transmission gate network comprises the bi-directional connect module performing the operations of:

segregating the transmission gate network into a driver network and a receiver network, wherein the driver network comprises a digital driver terminal T_out and the receiver network comprises a digital receiver terminal T_in; and segregating the digital port of the bi-directional connect module such that a digital output port of the bi-directional connect module is connected to T_in, and a digital input port of the bi-directional connect module is connected to T_out.

19. The system of claim 18, wherein evaluating the bi-directional connect module and the transmission gate network further comprises the bi-directional connect module performing the operations of:

determining the analog driving force that the analog circuit segment contributes to the bi-directional connect module through the analog port; and outputting the analog driving force to T_in through the digital output port.

20. The system of claim 18, wherein the bi-directional connect module and the transmission gate network further comprise the transmission gate network performing the operations of:

determining a first logic value that T_out would output if the analog circuit segment was not contributing an analog driving force to the transmission gate network through the digital output port of the bi-directional connect module;

outputting the first logic value to the digital input port through T_out, thereby contributing the digital driving force to the analog circuit segment through the bi-directional connect module; and determining a second logic value that T_out would output after accounting for the analog driving force from the digital output port.

21. The system of claim 17, wherein the method repeats for each connection point in the analog and mixed-signal circuit where an analog circuit segment connects to a transmission gate network of a digital circuit segment.

22. The system of claim 17, wherein the bi-directional connect module defers to the transmission gate network resolution of an analog signal to a digital logic value and resolution of a digital logic value to an analog signal.

* * * * *